United States Patent [19]
Duane et al.

[11] Patent Number: 5,872,038
[45] Date of Patent: Feb. 16, 1999

[54] SEMICONDUCTOR DEVICE HAVING AN ELEVATED ACTIVE REGION FORMED IN AN OXIDE TRENCH AND METHOD OF MANUFACTURE THEREOF

[75] Inventors: Michael Duane; Daniel Kadosh, both of Austin; Mark I. Gardner, Cedar Creek, all of Tex.

[73] Assignee: Advanced Micro Devices, Austin, Tex.

[21] Appl. No.: 780,643

[22] Filed: Jan. 8, 1997

[51] Int. Cl.$^6$ ................................................ H01L 21/336
[52] U.S. Cl. .......................... 438/279; 438/300; 438/305
[58] Field of Search .................. 438/279, 300, 438/564, 692, 305

[56] References Cited

U.S. PATENT DOCUMENTS

| | | | |
|---|---|---|---|
| 5,124,276 | 6/1992 | Samata et al. ........................... | 438/300 |
| 5,198,378 | 3/1993 | Rodder et al. ........................... | 438/300 |
| 5,270,234 | 12/1993 | Huang et al. ........................... | 438/692 |
| 5,371,026 | 12/1994 | Hayden et al. .......................... | 438/300 |
| 5,376,578 | 12/1994 | Hsu et al. . | |
| 5,597,746 | 1/1997 | Prall ....................................... | 438/300 |
| 5,677,573 | 10/1997 | Prall et al. . | |

OTHER PUBLICATIONS

S. Wolf. *Silicon Processing for the VLSI Era,* vol. 2: Processing Integration, pp. 154–169, copyright 1990, month unknown.

*Primary Examiner*—Richard A. Booth
*Attorney, Agent, or Firm*—Merchant, Gould, Smith, Edell, Welter & Schmidt, P.A.

[57] ABSTRACT

A process for forming a semiconductor device having an elevated active region is disclosed. The process includes forming a plurality of gate electrodes on the semiconductor substrate and disposing a thick oxide layer over the gate electrodes. A trench is formed in a thick oxide layer and is filled with a polysilicon material. The polysilicon material is subsequently doped in order to form an elevated active region above an active region of the substrate.

20 Claims, 7 Drawing Sheets

SEMICONDUCTOR DEVICE HAVING AN ELEVATED ACTIVE REGION FORMED IN AN OXIDE TRENCH AND METHOD OF MANUFACTURE THEREOF

FIELD OF THE INVENTION

The present invention is directed generally to a semiconductor device and a method of manufacture thereof and, more particularly, to such a device having elevated active regions.

BACKGROUND OF THE INVENTION

Over the last several decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which gate electrode 103 is disposed. The gate electrode 103 acts as a conductor. An input signal is typically applied to the gate electrode 103 via a gate terminal (not shown). Heavily doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral dimensions of the device structure. As the device structure dimensions are reduced laterally, it also becomes necessary to scale down the vertical dimensions of the device.

The source/drain junction is an important vertical dimension which must be scaled down as the device structure is made smaller. For a MOS device having a channel length of less than 0.8 $\mu$m, for example, the source/drain junction depths must be scaled down to less than 250 nm in order to maintain adequate device performance. A decrease in junction depths, however, limits the ability to subject the junction to silicidation since, if the junction is too shallow, the entire junction can be consumed during the silicidation process.

A number of different approaches have been proposed for forming shallow junctions in silicon. In one approach, it has been proposed to perform the implantation of the source/drain dopant after the silicide layer has been formed with diffusion of the dopant through the silicide into the substrate. Another proposed solution uses selective epitaxial growth of silicon over the source/drain regions of the device being formed. These processes are generally time consuming and expensive. A more detailed description of such processes are described in S. Wolf, *Silicon Processing for the VLSI Era*, Vol. 2: Processing Integration, pp. 154–169.

SUMMARY OF THE INVENTION

Generally, the present invention relates to a semiconductor device having an elevated active region and a method of fabrication thereof. In accordance with one embodiment of the invention, a process for fabricating such a semiconductor device includes: the formation of a plurality of gate electrodes on a substrate, an active region in the substrate generally being defined by adjacent walls of two gate electrodes; the formation of a relatively thick insulating layer over the gate electrodes and the active region; etching a trench in the thick insulating layer to expose a portion of the active region of the substrate; filling the trench with a polysilicon material; and doping the polysilicon material to form an elevated active region above the active region of the substrate.

In accordance with on aspect of the invention, a shallow active region is formed in the substrate by implanting dopants into the substrate prior to filling the trench. In an alternative embodiment, the shallow active region may be formed by doping the polysilicon material in the trench in such a manner that sufficient dopants diffuse into the substrate to form a desired shallow junction. In accordance with another aspect of the invention, the shallow and elevated active regions form an effective source/drain region of a semiconductor device. A surface of the elevated active region may have a silicide layer formed thereon in accordance with another aspect of the invention. In accordance with still other aspects of the invention, nitride layers may be formed on the surfaces of the gate electrodes to facilitate processing of the polysilicon material and for the formation of silicide layers on the surfaces of the gate electrodes.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
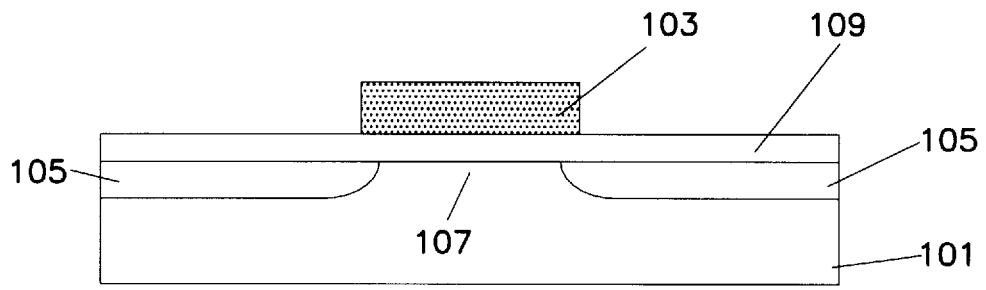
FIG. 1 illustrates basic components of a typical MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices as they are scaled down. The present invention is particularly suited to MOS structures where it is desirable to form shallow active regions. While the present invention is not so limited, an appreciation of various aspects of the invention will be gained through a discussion of the fabrication process and characteristics of such a device in connection with the examples provided below.

In accordance with an aspect of the present invention, an elevated active region is disposed above a relatively shallow implanted active region of the substrate. The elevated active region facilitates subsequent processing during fabrication. For example, a silicide layer may be formed on the surface of the elevated active region without consuming the implanted shallow active region.

Figure 2A:
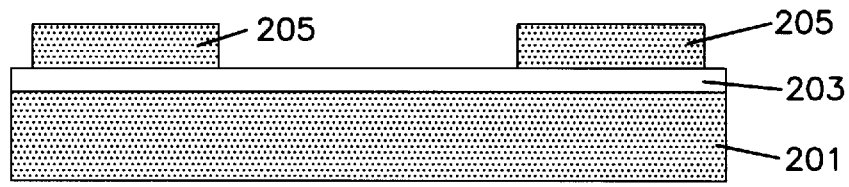
FIGS. 2A–2D illustrate a fabrication process of a semiconductor device in accordance with an embodiment of the invention.
Figure 2B:
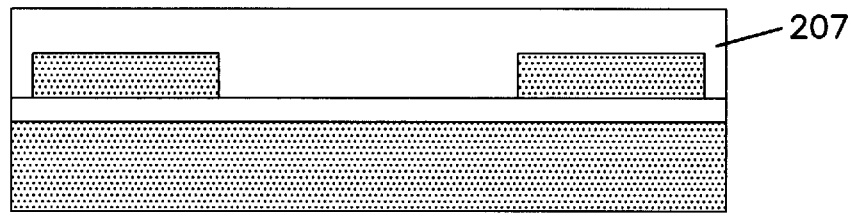

A fabrication process in accordance with one particular embodiment of the invention will be described with reference to FIGS. 2A–2D. Using conventional techniques, a number of gate electrodes are disposed on a semiconductor substrate 201. The gate electrode is insulated from the substrate 201 by a gate oxide layer 203 as illustrated in FIG. 2A. Adjacent walls of the gate electrodes 205 generally define portions of the substrate 201 where active regions will be formed. A relatively thick oxide layer is formed over the entire surface of the gate electrode structure as illustrated in FIG. 2B. The oxide layer 207 should be thick enough to facilitate subsequent processing as described below. For example, the thickness of the oxide layer 207, as measured from the surface of the gate oxide layer 203, may be twice that of the gate electrode 205.

Figure 2C:
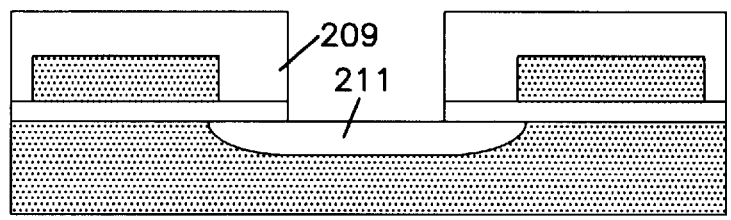

Portions of the thick oxide layer 207 and the gate oxide layer 203 are etched to form a trench between adjacent gate electrodes 205. The trench exposes a portion of the substrate 201 where an active region is to be formed. As the trench is etched, portions 209 of the thick oxide layer 207 are left between the edges of the trench and the adjacent walls of the gate electrodes 205. Following formation of the trench, a dopant of a desired type is implanted in the substrate 201 to form a shallow active region 211, such as a source/drain region. The resultant structure is depicted in FIG. 2C.

Figure 2D:
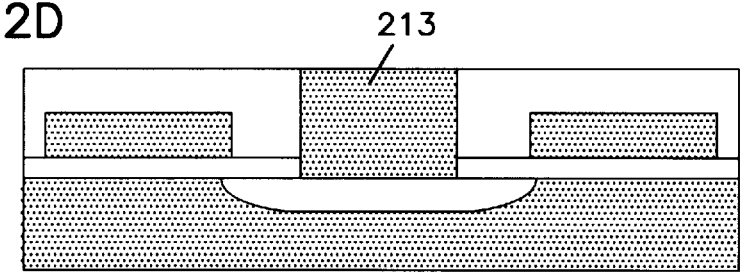

The trench is next filled with a polysilicon material 213. The surface of the polysilicon material 213 is then planarized using a dry etch, chemical mechanical polishing (CMP), or other suitable process. The planarized polysilicon material 213 is implanted with a dopant of the same conductivity type as the dopant implanted into the substrate in order to activate the polysilicon material 213. In this manner, an elevated active region 213 is formed above the implanted active region 211 as depicted in FIG. 2D. When the shallow active region 211 is used as a shallow source/drain region within the substrate 201, for example, the elevated active region 213 functions as an elevated source/drain. As will be appreciated, a silicide layer may be formed on the surface of the elevated active region 213 without consuming the shallow active region 211 in the substrate 201.

In the above embodiment, the shallow active region 211 is formed by implanting dopants into the substrate prior to filling the trench with the polysilicon layer 213. In an alternative embodiment of the invention, the shallow active region and the elevated active region may be formed using a single implantation process. An example of one particular embodiment of a single implantation process will be described with reference to FIGS. 3A–3D.

Figure 3A:
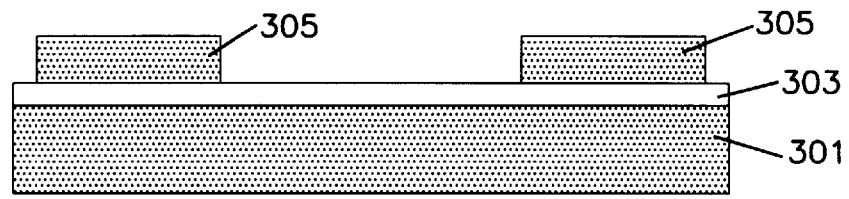
FIGS. 3A–3D illustrate another fabrication process in accordance with another embodiment of the invention.
Figure 3B:
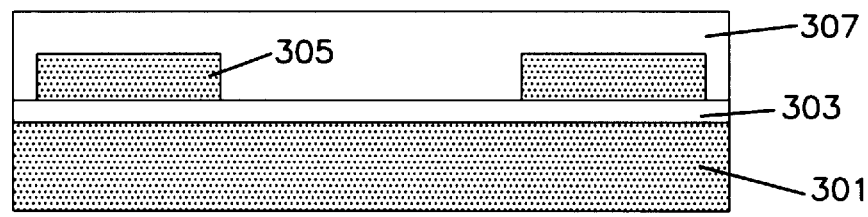
Figure 3C:
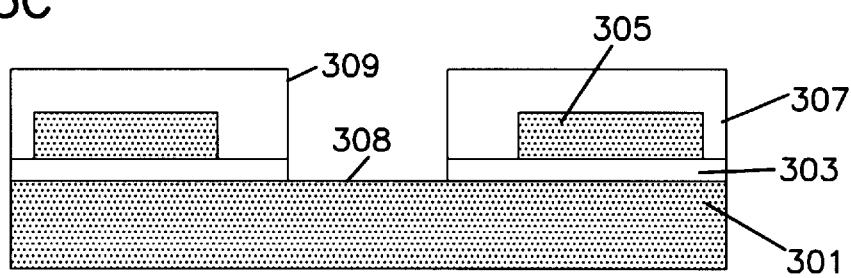

As in the process depicted in FIGS. 2A–2D, a number of gate electrodes 305 are disposed on a gate oxide layer 303. The gate oxide layer 303 is disposed on a surface of substrate 301, as illustrated in FIG. 3A. A relatively thick oxide layer 307 is formed over the surface of the entire structure as illustrated in FIG. 3B. With reference to FIG. 3C, a trench in the oxide layer 307 is etched to expose a portion 308 of the substrate 301, where an active region will be formed. The width of the trench is selected to leave portions 309 of the oxide layer 307 between the trench edges and the gate electrodes 305 intact to sufficiently insulate the gate electrodes 305 from an elevated active region which will be formed in the trench.

Figure 3D:
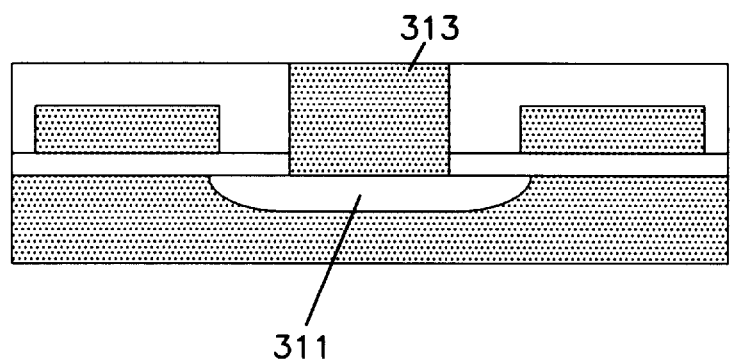

The trench in the oxide layer 307 is filled with a polysilicon material 313 as illustrated in FIG. 3D. The surface of the polysilicon material 313 is planarized using a dry etch, CMP or other suitable process. A dopant of a desired type is implanted into the polysilicon material 313 in order to activate the polysilicon material 313. The dopant used to dope the polysilicon material 313 also diffuses through the polysilicon material 313 into the substrate 301. The dopant, dosages, and energies are selected to allow a sufficient amount of the dopant to diffuse into the substrate to form a shallow active region 311 within the substrate 301 as illustrated in FIG. 3D. In this manner, both the polysilicon material 313 and the substrate can be activated using a single implantation process.

Figure 4A:
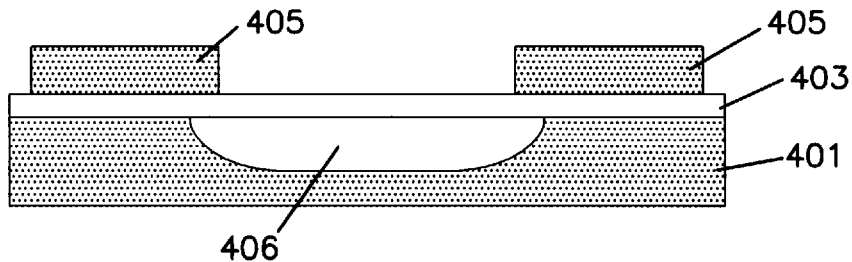
FIGS. 4A–4D illustrate yet another fabrication process in accordance with a particular embodiment of the invention.
Figure 4B:
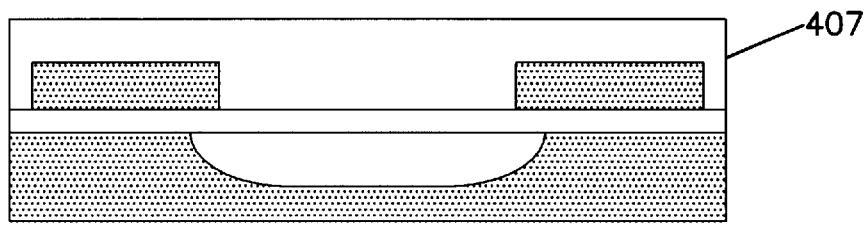
Figure 4C:
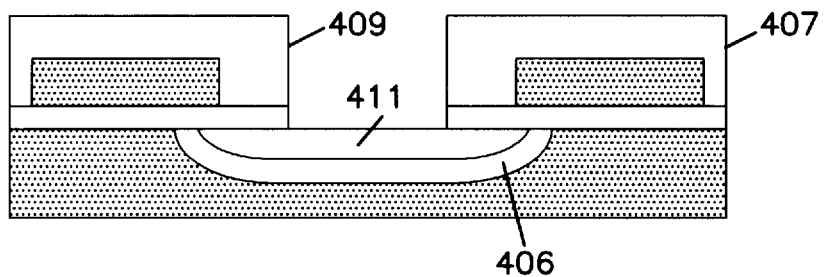

FIGS. 4A–4D illustrates still another fabrication process in accordance with the present invention. In accordance with this process, gate electrodes are formed on the substrate as described previously. At this stage, a first dopant is used to form a lightly doped drain (LDD) region 406 in the region of the substrate 401 defined by adjacent walls of the gate electrodes 405. A relatively thick oxide layer 407 is then formed over the resultant structure as illustrated in FIG. 4B. A trench is formed within the thick oxide layer 407 to expose a portion of the active region of the substrate 401 as depicted in FIG. 4C. A second dopant is then implanted into the portion of the substrate 401 exposed by the trench to form a shallow source/drain region within the substrate as illustrated in FIG. 4C. In the manner, a shallow LDD source/drain region is formed as an active region in the substrate 401.

Figure 4D:
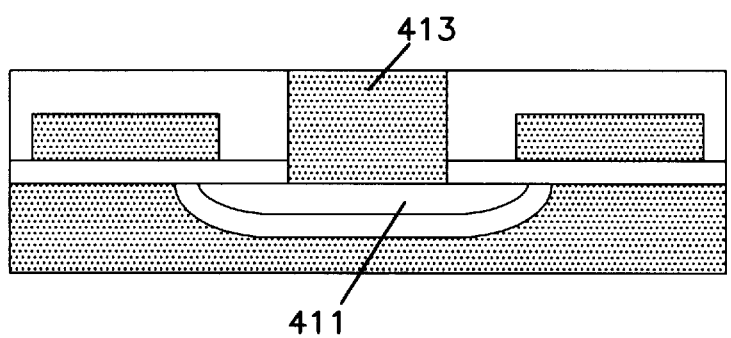

The trench is filled with a polysilicon material 413 which is planarized and activated by implanting a dopant into the polysilicon material 413. The resultant structure includes an elevated active region as illustrated in FIG. 4D. Alternatively, it will be appreciated that the process illustrated in FIGS. 4A–4D may be modified to form the shallow source/drain junction 411 using a single implantation step by diffusion of the dopant used to dope the polysilicon material 413 into the substrate 401.

Figure 5A:
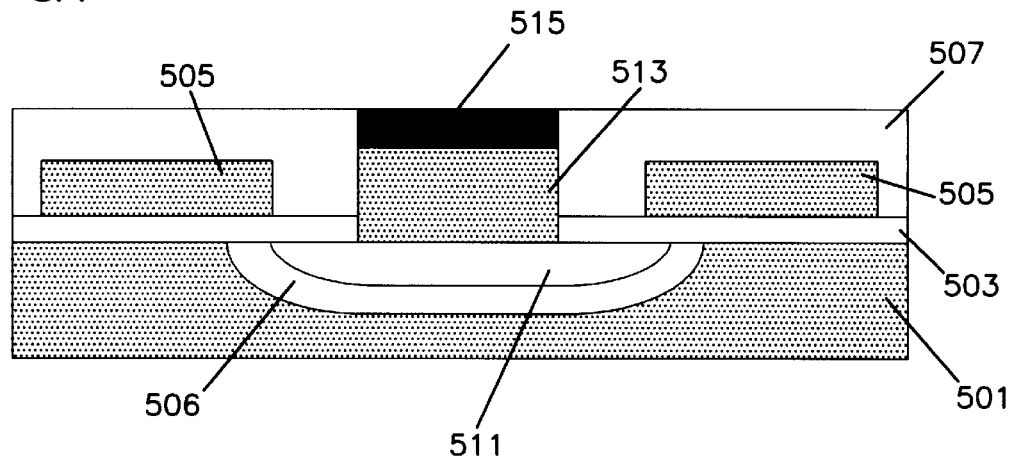
FIGS. 5A–5B illustrates exemplary semiconductor devices in accordance with various embodiments of the present invention.
Figure 5B:
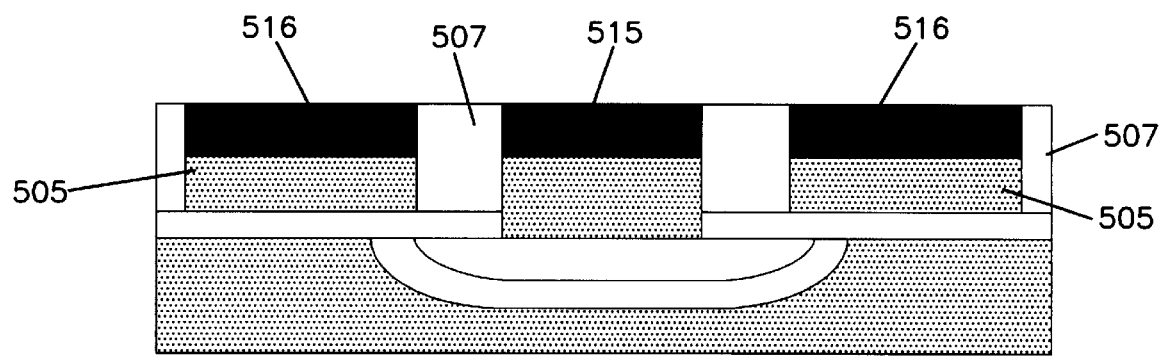

FIG. 5A illustrates a typical LDD structure which could be manufactured using the process described above. In FIG. 5A, a plurality of gate electrodes 505 are disposed on a gate oxide layer 503 which functions to insulate the gate electrodes 505 from active regions in the substrate 501. An LDD region 506 and a source/drain region 511 is formed within a substrate 501. An elevated active region 513 is formed over the source/drain region 511. Disposed on an upper surface of the elevated active region 513 is a silicide layer 515 which is used to connect the source/drain region 511 to other elements on the chip. As will be appreciated from the device depicted in FIG. 5A, the gate electrodes 505 do not have a silicide layer formed on the surface thereof. In an alternative embodiment, illustrated in FIG. 5B, a silicide layer 516 is formed on the surface of the gate electrodes 505 by additionally etching trenches in the oxide layer 507 to expose the surface of the gate electrodes 505. This etching process could be performed at the same time the trench is etched or could be separate patterning and etching steps.

Figure 6A:
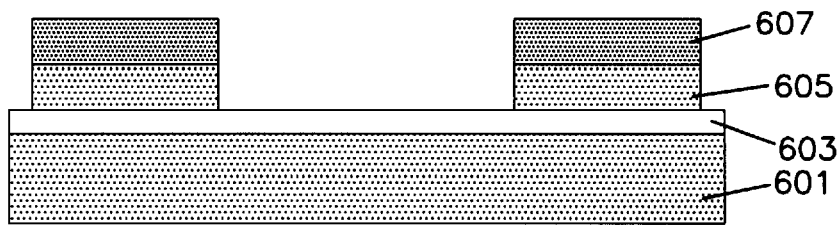
FIG. 6A–6F illustrates still another fabrication process in accordance with another particular embodiment of the invention.
Figure 6B:
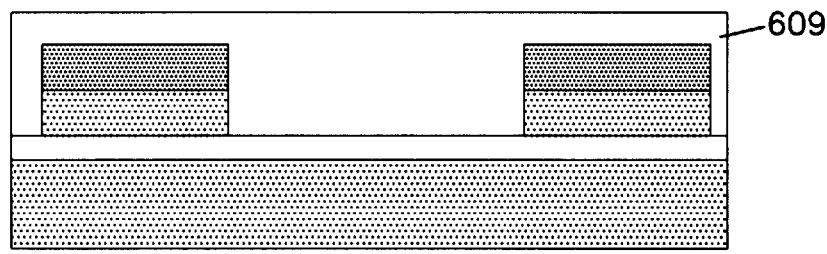
Figure 6C:
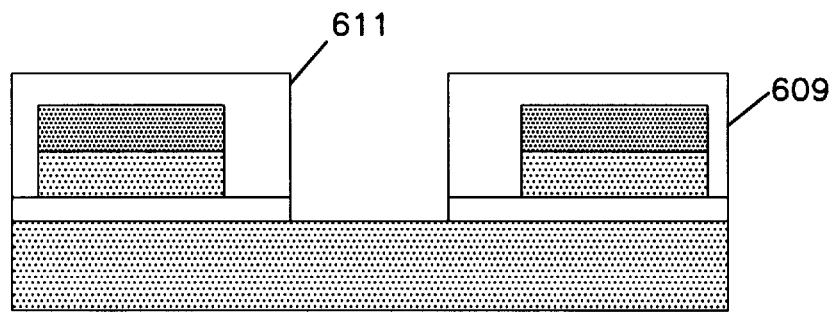
Figure 6D:
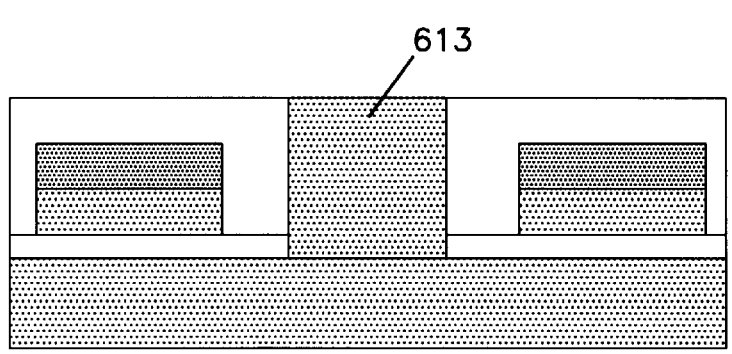

In another embodiment of the present invention, nitride stop layers are used to facilitate planarization of the polysilicon material. In this process, a gate oxide layer 603 is formed on a substrate 601. Polysilicon gates 605 and nitride layers 607 are formed over the gate oxide layer as illustrated in FIG. 6A. A relatively thick oxide layer 609 is formed over the resultant structure as illustrated in FIG. 6B. A trench is then formed in the oxide layer 609 leaving intact portions 611 of the oxide layer adjacent to the side walls of the polysilicon gates 605 and nitride layers 607. The trench is then filled with a polysilicon material 613 as illustrated in FIG. 6D.

Figure 6E:
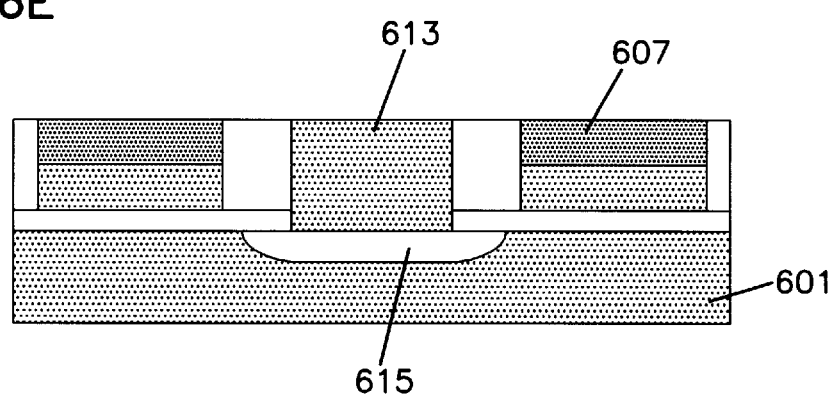
Figure 6F:
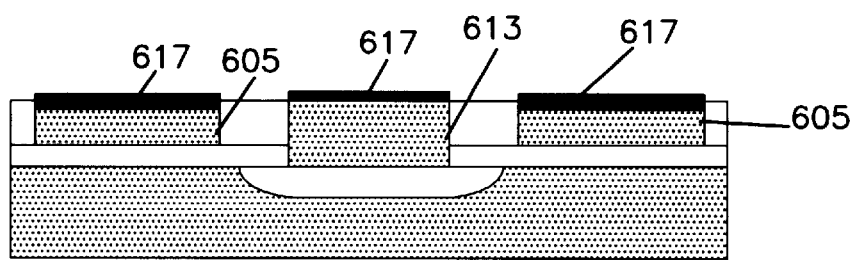

The polysilicon material is then planarized using a CMP process. The nitride layers are used as a stop layer for the CMP process. The planarized polysilicon material 613 is doped to form an elevated active region. A shallow active region 615 may be formed by diffusion of the dopant material into the substrate 601. Alternatively, as described above in connection with the various embodiments, the active region 615 could be formed using a separate implantation step prior to filling the trench. Also, an LDD implant could be used to form an LDD structure if desired. In the above manner, a shallow active region 615 and an elevated active region 613 is formed as illustrated in FIG. 6E. The nitride layer 607 may then be etched and a silicide layer 617 may be formed on the upper surfaces of the gate electrodes 605 and the elevated active region 613 as illustrated in FIG. 6F. The resultant structure may by used as part of a semiconductor device having a shallow source/drain region and an elevated source/drain region.

As noted above, the present invention is applicable to fabrication of a number of different devices where elevated active regions may be used to facilitate vertical scaling down of the overall device. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process of forming a semiconductor device, the process comprising:

forming a plurality of gate electrodes on a substrate, an active region of the substrate being defined by adjacent walls of two gate electrodes;

forming an insulating layer over the gate electrodes and the active region;

etching a trench in the insulating layer to expose a portion of the active region of the substrate;

filling the trench with a polysilicon material; and doping the polysilicon material to form an elevated active region above the active region of the substrate.

2. A process as recited in claim 1, wherein the insulating layer comprises an oxide layer.

3. A process as recited in claim 1, further comprising implanting a dopant into the active region of the substrate through the trench prior to filling the trench with the polysilicon material.

4. A process as recited in claim 1, wherein the doping of the polysilicon material includes diffusing the dopant through the polysilicon material to dope a region in the active region of the substrate.

5. A process as recited in claim 1, further comprising planarizing the polysilicon material prior to the doping of the polysilicon material.

6. A process as recited in claim 1, further comprising:

forming a nitride layer on the gate electrodes prior to forming the insulating layer; and chemical mechanical polishing the resultant structure, prior to the doping of the polysilicon material, to planarize the polysilicon material using the nitride layer as a stop layer.

7. A process as recited in claim 6, further comprising:

removing the nitride layer on the gate electrodes;

forming a silicide on a surface of the gate electrodes and on a surface of the elevated active region.

8. A process as recited in claim 1, further comprising:

implanting a first dopant into the active region of the substrate prior to forming the insulating layer to form an LDD region in the active region of the substrate; and implanting a second dopant using the trench as a pattern to form a source/drain region in the active region of the substrate.

9. A process as recited in claim 1, further comprising forming a silicide layer on a surface of the elevated active region.

10. A process of forming a metal-oxide-semiconductor (MOS) device having an elevated source/drain region, the process comprising:

forming a gate oxide layer on a surface of a substrate;

forming a plurality of gate electrodes on a surface of the gate oxide layer to form a resultant structure, adjacent sides of two gate electrodes defining an active region of the substrate for the formation of a source/drain region in the substrate;

forming an oxide layer over the resultant structure;

forming a trench in the oxide layer between the adjacent sides of the two gate electrodes to expose the surface of the substrate over a portion of the active region;

filling the trench with a polysilicon material;

implanting a dopant into the polysilicon material to form the elevated source/drain region and the source/drain in the active region of the substrate;

forming a silicide layer over a surface of the elevated source/drain region.

11. A process as recited in claim 10, further comprising forming an LDD region in the active region of the substrate using the gate electrodes as a mask prior to forming the oxide layer.

12. A process as recited in claim 1, wherein the insulating layer has a thickness of about twice a thickness of the gate electrodes.

13. A process as recited in claim 1, wherein the insulating layer has a thickness greater than a thickness of the gate electrodes.

14. A process as recited in claim 1, wherein etching the trench in the insulating layer leaves portions of the insulating layer between edges of the trench and sidewalls of the gate electrodes.

15. A process as recited in claim 10, wherein forming the trench in the oxide layer leaves portions of the oxide layer between edges of the trench and sidewalls of the gate electrodes.

16. A process as recited in claim 10, wherein the oxide layer has a thickness greater than a thickness of the gate electrodes.

17. A process of forming a semiconductor device, comprising:

forming a plurality of gate electrodes on a substrate, an active region of the substrate being defined by adjacent walls of two gate electrodes;

forming an insulating layer having a thickness greater than a thickness of the gate electrodes over the gate electrodes and the active region;

removing portions of the insulating layer to form a trench over a portion of the active region of the substrate and leaving portions of the insulating layer between edges of the trench and sidewalls of the gate electrodes;

filling the trench with a polysilicon material; and doping the polysilicon material to form an elevated active region above the active region of the substrate.

18. A process as recited in claim 17, further comprising implanting a dopant into the active region of the substrate through the trench prior to filling the trench with the polysilicon material.

19. A process as recited in claim 17, wherein doping of the polysilicon material includes diffusing the dopant through the polysilicon material to dope a region in the active region of the substrate.

20. A process as recited in claim 17, wherein the thickness of the insulating layer is about twice the thickness of the gate electrodes.

* * * * *